United States Patent [19]

Gamo

[11] 4,259,682
[45] Mar. 31, 1981

[54] SEMICONDUCTOR DEVICE

[75] Inventor: Hiroshi Gamo, Itami, Japan

[73] Assignee: Mitsubishi Denki Kabushiki Kaisha, Tokyo, Japan

[21] Appl. No.: 946,828

[22] Filed: Sep. 28, 1978

Related U.S. Application Data

[63] Continuation of Ser. No. 789,271, Apr. 20, 1977, abandoned.

[30] Foreign Application Priority Data

Apr. 27, 1976 [JP] Japan .................................. 51/49008

[51] Int. Cl.³ .................... H01L 29/06; H01L 29/747
[52] U.S. Cl. ...................................... 357/55; 29/583; 357/38; 357/56
[58] Field of Search ................. 357/55, 56, 38; 29/583

[56] References Cited

U.S. PATENT DOCUMENTS

| | | | |
|---|---|---|---|
| 3,608,186 | 9/1971 | Hutson | 357/55 |
| 3,735,483 | 5/1973 | Sheldon | 357/55 |
| 3,801,390 | 4/1974 | Lepselter | 357/55 |
| 3,806,771 | 4/1974 | Petruzella | 357/55 |
| 3,821,782 | 6/1974 | Hutson | 357/55 |
| 3,970,843 | 7/1976 | Dumas | 357/55 |
| 3,972,113 | 8/1976 | Nakata et al. | 357/56 |
| 3,997,964 | 12/1976 | Holbrook et al. | 357/55 |
| 4,016,593 | 4/1977 | Konishi et al. | 357/55 |
| 4,058,824 | 11/1977 | Claassen | 357/55 |
| 4,063,272 | 12/1977 | Boah et al. | 357/55 |

Primary Examiner—Andrew J. James
Attorney, Agent, or Firm—Wenderoth, Lind & Ponack

[57] ABSTRACT

A semiconductor wafer is provided with a plurality of semiconductor pellets arranged in rows and columns in a checkered pattern on its main opposite faces. A groove in the form of a closed loop is disposed around each pellet on one of the main faces and is spaced from grooves encircling the adjacent pellets to leave a grid between the pellets, and grooves are disposed on the other main face which simply separate the pellets. All the grooves are covered with glass passivation layers. The wafer is divided into the semiconductor pellets by dicing it along the central lines of the bars forming the grid.

2 Claims, 9 Drawing Figures

SEMICONDUCTOR DEVICE

This is a Continuation of application Ser. No. 789,271, filed Apr. 20, 1977 and now abandoned.

BACKGROUND OF THE INVENTION

This invention relates to semiconductor devices formed in large numbers on a single semiconductor wafer and then diced into individual devices. The devices of the present invention are designed so as to increase the yield from a single wafer.

Power semiconductor elements with a current capacity of from several to ten-odd amperes widely employed at present have a mesa type glass passivation structure. They are advantageous in that manufacturing costs are low while the surface condition is well stabilized and the electric characteristics are excellent. Therefore those elements can be encapsuled in plastic coverings. However, power semiconductor elements of the type referred to are disadvantageous in that the semiconductor wafer in which they are formed during their manufacture is easily broken owing to both the grooving of the wafer and residual strains developed in the wafer as a result of a difference in the coefficient of thermal expansion between the particular semiconductive material such as silicon and the associated passivation material such as glass. This has imposed a limitation on the diameter of semiconductor wafers attended by an inability to achieve a further reduction in manufacturing cost.

Accordingly it is an object of the present invention to provide a new and improved semiconductor device formed as one of a plurality of such devices in a single semiconductor wafer at a reduced cost by increasing the yield of the devices from the wafer without causing a deterioration of electric characteristics thereof.

SUMMARY OF THE INVENTION

The present invention provides a semiconductor device comprising a semiconductor pellet including a pair of main opposite faces and having at least one pn junction disposed therein, and a separating groove disposed on each of the main faces of the pellet for separating the at least one pn junction wherein the separating groove on one of the main faces is in the form of a closed loop encircling a substantial portion of the semiconductor pellet and surrounded by a peripheral portion of the semiconductor pellet.

The peripheral portion of the semiconductor pellet may protrude beyond the one main face of the essential portion of the semiconductor pellet.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
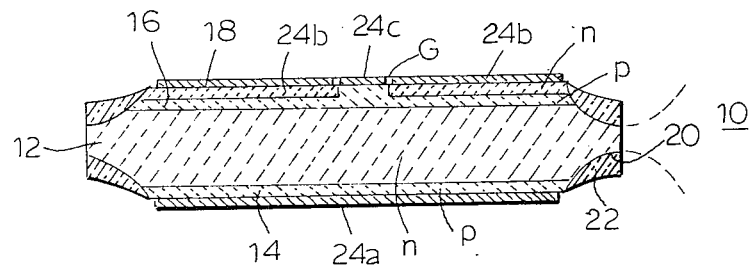
FIG. 1 is a cross sectional view of a pellet of a glass passivation mesa type thyristor having the conventional structure.

Referring now to FIG. 1 of the drawings, there is illustrated a power transistor with a current capacity of from several to ten-odd amperes having a mesa type glass passivation structure and which is widely employed at present. The arrangement illustrated comprises a semiconductor pellet generally designated by the reference numeral 10 including a semiconductor matrix 12 that is an n type silicon wafer having a pair of main opposite faces, a pair of p type semiconductor layers 14 and 16 disposed on the main faces of the wafer 12 by diffusing a suitable p type impurity into the latter to form respective pn junctions therebetween, and a centrally apertured n type semiconductor layer 18 disposed on the n type semiconductor layer 16 by a selective diffusion technique known in the art to form a pn junction therebetween and leave a central opening or window G thereon to which the n type semiconductor layer 16 is exposed.

As seen in FIG. 1, the semiconductor pellet 10 is tapered on the entire edge portion shown at 20 from both main faces thereof and all the junctions along with portions of the n type layer 12 are exposed at the ends to the tapered edge portion 20 formed of one half of a mesa groove. Then a glass passivation layer 22 is applied to the groove or tapered edged portion to protect the exposed ends of the pn junctions. The arrangement further comprises a metallized layer 24a disposed on the entire surface of the p type semiconductor layer 14 and a centrally apertured metallized layer 24b disposed on the apertured n type semiconductor layer 18 in a manner well known in the art. Also a circular metallized layer 24c is similarly disposed on the exposed surface of the p type semiconductor layer 16 and is spaced from the apertured metallized layer 24b.

Respective electrodes (not shown) are adapted to be attached to the metallized layers 24a, 24b and 24c through a brazing material.

Figure 2:
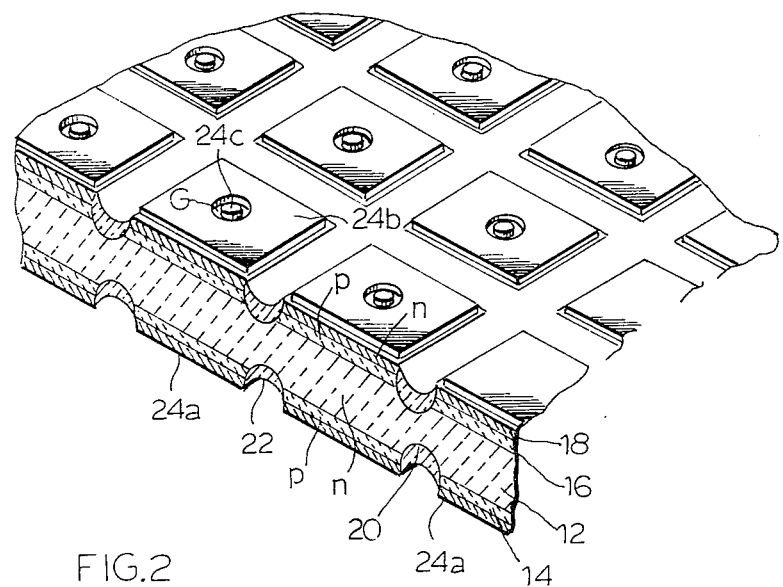
FIG. 2 is a fragmental perspective view, partly in cross section of a semiconductor wafer before it is divided into a plurality of pellets such as shown in FIG. 1 and after the completion of all the manufacturing steps conducted on the semiconductor wafer.

A plurality of semiconductor pellets each shown in FIG. 1 can be simultaneously manufactured from a single semiconductor wafer having a large area as illustrated in FIG. 2 wherein like reference numerals designate components identical to those shown in FIG. 1. In FIG. 2 the semiconductor wafer is shown as including a plurality of rectangular semiconductor pellets 10 arranged in rows and columns and grooves 20 running on either of the main opposite faces of the wafer between the adjacent pellets to space the pn junctions disposed in each pellet 10 from those disposed in the adjacent pellets 10. The grooves 20 on one of the main faces of the wafer are aligned with those on the other main face in the direction of the thickness of the wafer. It will readily be understood that the p type diffusion layers 14 and 16 are formed in the wafer throughout the entire area in the well known manner and that the apertured diffusion layers 18 are selectively formed in place on the wafer in a manner well known in the art. Then a glass passivation layer 22 is applied to each groove 20 and the metallized layers 24a, 24b and 24c are disposed in place on the wafer as by electroplating technique.

The semiconductor wafer is diced along the central line at the bottom of each groove 20 on one of the main faces of the wafer to divide it into the plurality of semiconductor pellets 10.

Therefore the semiconductor pellet 10 has the following advantages:
(1) The workability is good and a reduction in manufacturing cost is possible because the principal manufacturing steps including the passivation of the pn junctions and metallizing are conducted on a single wafer of semiconductive material having a large diameter.
(2) The surface condition is extremely well stabilized and the resulting electric characteristics are excellent because an electrically insulating material such as glass for the passivation of the pn junctions is enamelled or baked on the semiconductor wafer at an elevated temperature; and
(3) It is possible to encapsule the pellet in a plastic material.

However the semiconductor wafer processed as above described has been disadvantageous in that it is very apt to be broken owing to residual strains therein. This is because grooves are formed in the wafer to partition the latter into pellets and because the passivation layer is formed of an electrically insulating material having a different coefficient of thermal expansion from the semiconductive material of the wafer, for example, glass. Thus the diameter of semiconductor wafers has been able to be increased only to a certain limited magnitude which has prevented a further reduction in manufacturing cost.

Also if it has been desired to increase the diameter of a semiconductor wafer it has been necessary to increase the thickness thereof. This measure has been said not to be desirable because the electric characteristics of the resulting element deteriorate, and more particularly there is an increased voltage drop thereacross.

The present invention seeks to eliminate the disadvantages of the prior art practice as above described by the provision of semiconductor devices manufactured at reduced costs by increasing the yield of semiconductor pellets from the wafer without causing deterioration of the electric characteristics of the pellets.

The present invention will now be described in detail with reference to FIG. 3 wherein like reference numerals designate components identical or similar to those shown in FIG. 1 or 2. The arrangement illustrated comprises a wafer 12 of n type semiconductor material such as silicon different from that shown in FIG. 2 only in that in FIG. 3 each groove 26 on one of the main faces, in the example illustrated the upper main face as viewed in FIG. 3 of the wafer 12, is in the form of a closed loop encircling a substantial portion of each rectangular semiconductor pellet 10 and leaving a rectangular grid 28 running between the adjacent grooves 26 to serve as combined connection and reenforcement members. The rectangular grid 28 is connected to a circumferential grid portion 28 left on the peripheral edge of the wafer. It will readily be understood that the portions forming grid 28 have respective exposed surfaces substantially flush with adjacent pellets 10.

On the other hand, each groove 22 on the other or lower main face of the semiconductor wafer 12 is similar to the corresponding groove shown in FIG. 2 but has a width substantially equal to the total width of the grooves 26 and the semiconductor grid portions 28 located just thereabove.

Figure 3:
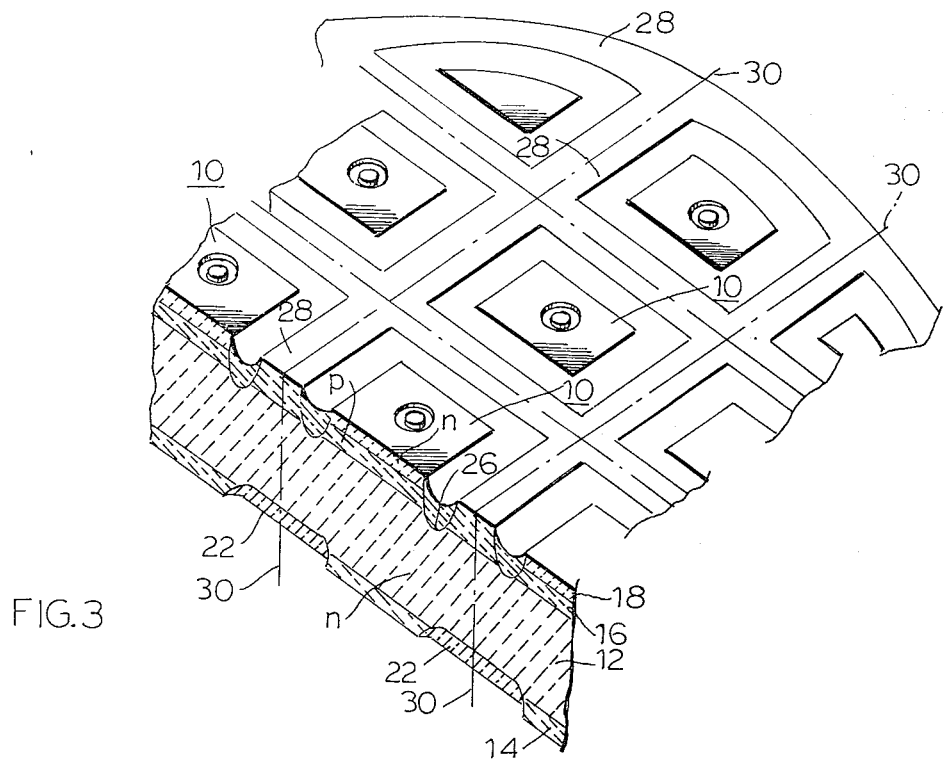
FIG. 3 is a fragmental perspective view, partly cross section, of a semiconductor wafer useful in explaining one embodiment of the present invention.

In the arrangement of FIG. 3 it will be appreciated that the wafer 12 has an effective thickness larger than that of the wafer shown in FIG. 2 and becomes strong like a glass plate in a window frame.

After having the metallized layers (not shown) disposed on predetermined portions thereof as above described in conjunction with FIGS. 1 and 2, the arrangement of FIG. 3 is ready for dicing into pellets. This dicing is accomplished along the central line of each of the combined connection and reenforcement grid portions 28 as shown by the broken line 30 in FIG. 3.

As an example, a plurality of semiconductor pellets were formed into squares having each side 3.5 millimeters long in a semiconductor wafer 220 microns thick and upper grooves such as the grooves 26 and grid portions such as the portions 28 were provided on the upper main face of the wafer having widths of about 0.2 and 0.4 millimeter respectively. Lower main face grooves such as the grooves 22 were also provided having a width of about 0.8 millimeter and a depth of 65 microns. While conventional processes have been used to process semiconductor wafers having the maximum diameter of 40 millimeters, the inventor has found that, for semiconductor wafers having the structure as shown in FIG. 3, the diameter thereof can be increased to 55 millimeters and hardly any breaks or fissures occur.

Figure 4:
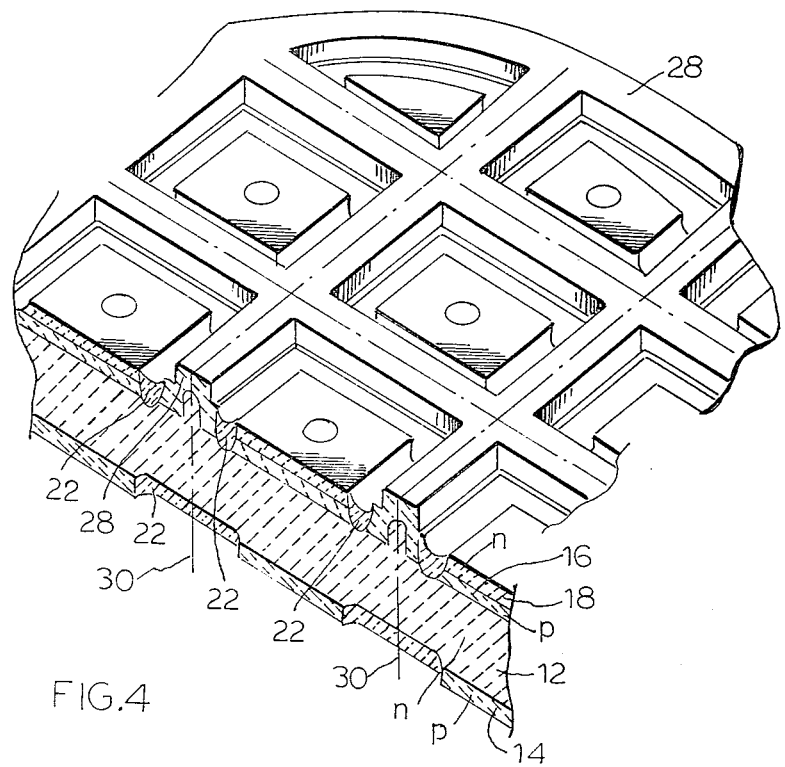
FIG. 4 is a view similar to FIG. 3 but illustrating another embodiment of the present invention.

In FIG. 4 wherein like reference numerals designate components identical or corresponding to those shown in FIG. 3, there is shown a modification of the present invention. The arrangement illustrated is different from that shown in FIG. 3 only in that in FIG. 4 the grid portions 28 protrude somewhat above the associated main face of the semiconductor pellets 10. The strength of the semiconductor wafer shown in FIG. 4 is further increased. For example, it has been found that, by extending the grid portion 28 from the associated main face of the semiconductor pellets 10 about 60 microns, semiconductor wafers having a diameter of 65 millimeters can be used without any break or fissure and with the dimensions of the remaining components remaining unchanged from those described in conjunction with FIG. 3.

The arrangement of FIG. 4 can be formed according to a manufacturing process shown in the parts of FIG. 5 wherein like reference numerals designate components identical to those shown in FIG. 4.

Figure 5A:
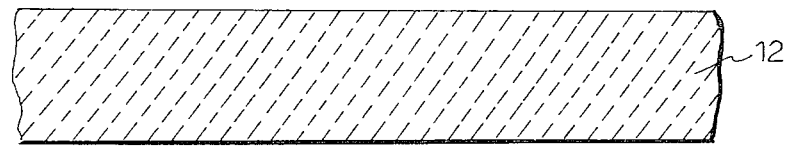
FIGS. 5a through 5e are fragmental cross sectional views of a semiconductor wafer illustrating the manufacturing steps of a process for manufacturing the embodiment shown in FIG. 4.

FIG. 5a shows one portion of an n type silicon wafer 12 having a resistivity of from 15 to 25 ohms-centimeter, a thickness of 280 microns and a diameter of 65 millimeters.

One of main opposite faces, in this case, the upper main face, as viewed in FIG. 5a of the semiconductor wafer is selectively masked with any suitable wax to form strip-shaped masked zones 28 0.5 millimeter wide in a checkerboard pattern a equal intervals of 3.5 millimeters for forming the grid portions 28 later and also on the peripheral portion of the wafer 12 while the other or lower main face thereof is entirely masked. Thereafter about 60 microns of the thickness of the wafer is etched away in a manner well known in the art to form on the upper main face of the wafer strip-shaped protrusions 28 in the checkerboard pattern encircled by a strip-shaped circumferential protrusion.

Figure 5B:
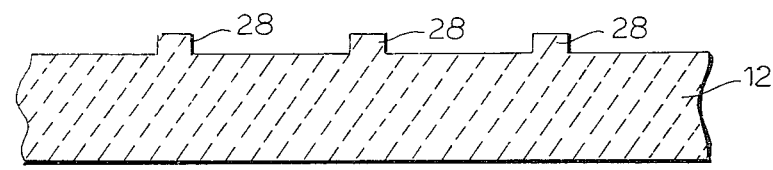

The resulting structure is shown in FIG. 5b wherein the circumferential protrusion is not illustrated.

Steps well known in the art are used to dispose a pair of p type semiconductor layers 14 and 16 on both main faces of the wafer 12 over the entire areas thereby to form opposite continuous pn junctions therebetween and then centrally apertured n type semiconductor layers 18 are formed on those portions of the p type semiconductor layer 16 confined by the protrusions also designated by the reference numeral 28 to form discrete pn junctions therebetween, one for each layer 18.

Figure 5C:
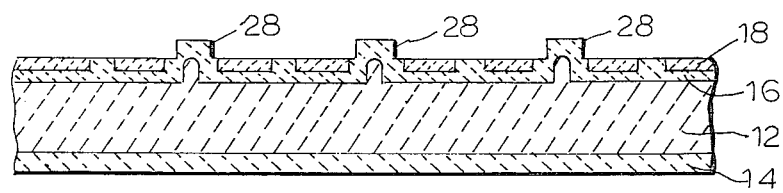
Figure 5D:
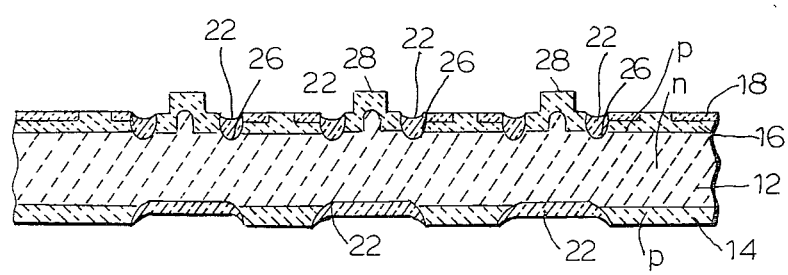

The resulting structure is illustrated in FIG. 5c.

Following this, the wafer 12 is provided on the upper main face with a plurality of mesa grooves 26 in the form of closed loops immediately laterally of the protrusions 28 to encircle the mating n type semiconductor layers 18 one for each layer 18 in a manner well known in the art. Those grooves 26 extend through the p type semiconductor layer 16 until they reach the n type semiconductor layer 12. Simultaneously the lower main face of the wafer is provided with a plurality of grooves 20 located directly below the protrusions 28 to and extending into the n type layer 12. Each of the grooves 20 has a width substantially equal to the total width of the protrusion 28 and two adjacent grooves 26 located thereabove. The grooves 20 and 26 space the pm junctions disposed below each of the p type semiconductor layers 18 away from those disposed below the adjacent layers 18 to form a plurality of thyristor pellets 10 in the wafer 12. Then a glass passivation layer is applied to each of the grooves 20 and 26 resulting in the structure shown in FIG. 5d or the arrangement illustrated in FIG. 3.

Figure 5E:
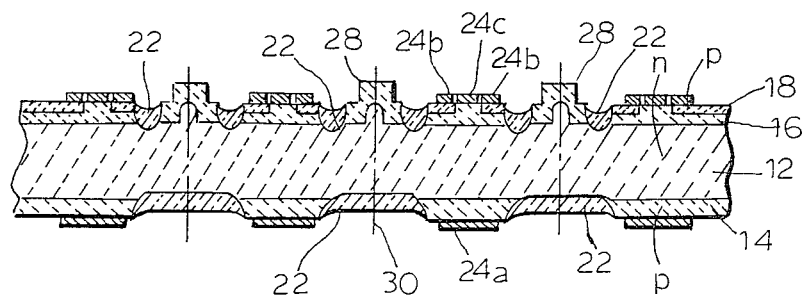

As shown in FIG. 5e, a metallized layer 24a, a centrally apertured metallized layer 242b and a small metallized layer 24c are disposed in ohmic contact with the p type layer 14, the centrally apertured n type layer 18 and the exposed surface of the p type layer 16 in a well known manner, respectively. Thereafter the semiconductor wafer shown in FIG. 5e is diced along dotted lines 30 centrally passed through the protrusions 28 as shown in FIG. 4 or 5e so as to be divided into the plurality of pellets 10.

Thus it is seen that the present invention provides a semiconductor device comprising a semiconductor pellet having a groove in the form of a closed loop disposed on one of the main faces thereof encircling a substantial portion thereof and surrounded with a peripheral portion formed of a semiconductive material of the starting wafer involved. Thus the semiconductor device is extremely resistant to formations of any break and/or any fissure therein. Also the present invention can increase the yield of semiconductor pellets.

While the present invention has been illustrated and described in conjunction with a few preferred embodiments thereof it is to be understood that numerous changes and modifications may be resorted to without departing from the spirit and scope of the present invention. For example, the present invention is equally applicable to transistors, semiconductor diodes etc., in addition the thyristors described herein. Also the passivation layer may be formed of any suitable material other than glass such as silicon dioxide ($SiO_2$) in the form of a film.

What is claimed is:

1. A semiconductor device comprising a semiconductor pellet having a pair of main opposite faces and having at least on pn junction disposed therein, and a separating groove disposed in each of said main faces of said pellet and extending through said at least one pn junction, said separating groove in one of said main faces of said semiconductor pellet being in the form of a closed loop encircling a substantial portion of said pellet, and a peripheral portion of said semiconductor pellet around said separating groove, and a projection on said peripheral portion formed of the same material as the pellet and integral with the semiconductor pellet protruding beyond the one main face of said substantial portion of said semiconductor pellet for substantially increasing the strength of the pellet.

2. A wafer of semiconductor material for being divided up into a plurality of semiconductor pellets, said wafer having a pair of main opposite faces and having at least one pn junction disposed therein, said wafer having a plurality of separating grooves in at least one face thereof, each being in the form of a closed loop and extending into said wafer through said at least one pn junction and defining in said wafer within the closed loops a plurality of wafer areas each having an outwardly facing main surface, said wafer further having portions between each of the adjacent loops and projections on said portions and extending around each of the closed loop separating grooves and projecting outwardly of said wafer past said main faces, said projections being of the material of the wafer and being integral with the wafer and being for substantially increasing the strength of the wafer and being the part of the wafer along which the wafer is diced for being divided up into a plurality of pellets, and a passivation material in each of said closed loop separating grooves.

* * * * *